Dec. 22, 1964 C. C. RAYBURN 3,162,721

COMPONENT LEAD-LOCKING ARRANGEMENT

Filed July 26, 1960 2 Sheets-Sheet 1

INVENTOR.
Charles C. Rayburn
BY
Robert D. Silver
ATT'Y.

Dec. 22, 1964 C. C. RAYBURN 3,162,721

COMPONENT LEAD-LOCKING ARRANGEMENT

Filed July 26, 1960 2 Sheets-Sheet 2

INVENTOR.
Charles C. Rayburn
BY Robert D. Silver
ATT'Y.

United States Patent Office 3,162,721
Patented Dec. 22, 1964

3,162,721

COMPONENT LEAD-LOCKING ARRANGEMENT

Charles C. Rayburn, Alexandria, Va., assignor to Illinois Tool Works Inc., a corporation of Delaware Filed July 26, 1960, Ser. No. 45,421
9 Claims. (Cl. 174—68.5)

This invention relates in general to a component lead locking arrangement and, more particularly, relates to means for locking an electrical component to a circuit board prior to soldering thereof.

For the past several years, the use of printed circuits on panel boards has increased in use. The electrical circuit is generally formed on a dielectric board by suitable deposition of an electrically conductive substance in a predetermined pattern. Various components are assembled in holes which are oriented relative to the aforementioned pattern in the circuit board to form a part of a complex network of many and varied uses. One common usage of printed circuit boards is in the communications field, such as radio and television appliances.

Since it is usual procedure to assemble many components on a single circuit board, it is apparent that the components are not all assembled thereto simultaneously. The general procedure is to assemble the separate components to the circuit board, and after all are assembled thereto, a soldering operation (usually by dip soldering) to firmly fix and electrically connect the components on the board and relative to the printed electrical pattern respectively, is generally accomplished by automatic machinery. The following problems have been noted relative to assembly of components to the circuit board prior to the soldering operation, namely (*a*) components are often dislodged from the board while the other components are subsequently being assembled into the board; (*b*) components often become tilted and/or elevated from the mounting holes as they are slapped or vibrated by the assembler or automatic machinery which handles the circuit boards for the soldering processes; and (*c*) immediately subsequent to the actual soldering of the components upon the board in the automatic soldering apparatus, the movement of the board from the soldering station for subsequent processing involves mass in motion problems or vibration problems such that the component leads may move in the holes while the solder is solidifying thereby producing a poor solder joint.

There have been some prior art attempts to avoid the problems above-noted which have not been commercially feasible in solving the above-noted problems in an economical repetitive manner.

It is a general object of this invention to provide a temporary lead-locking arrangement for attachment of an electrical component to a circuit board which is easy to manufacture and overcomes the aforenoted prior art problems.

It is another object of this invention to provide a component lead-locking arrangement which is easier to insert in printed circuit board than prior art types of component leads.

It is a further object of this invention to provide a lead-locking arrangement which is smooth and positive, requires less expensive materials due to relatively smaller diameter of wires required, which has positive shouldering thereby making over-all height repetitive and controlled.

Another object of this invention is to provide a lead-locking arrangement which provides positive results in spite of small dimensional variances in the size of the wire of the lead as well as in the size of the holes to which the leads are inserted.

The novel features that are characteristic of the invention are set forth with particularity in the appended claims. The invention itself, however, both as to its organization and method of operation, together with additional objects and advantages thereof will best be understood by the following description of specific embodiments when read in connection with the accompanying drawings, in which:

Figure 1:
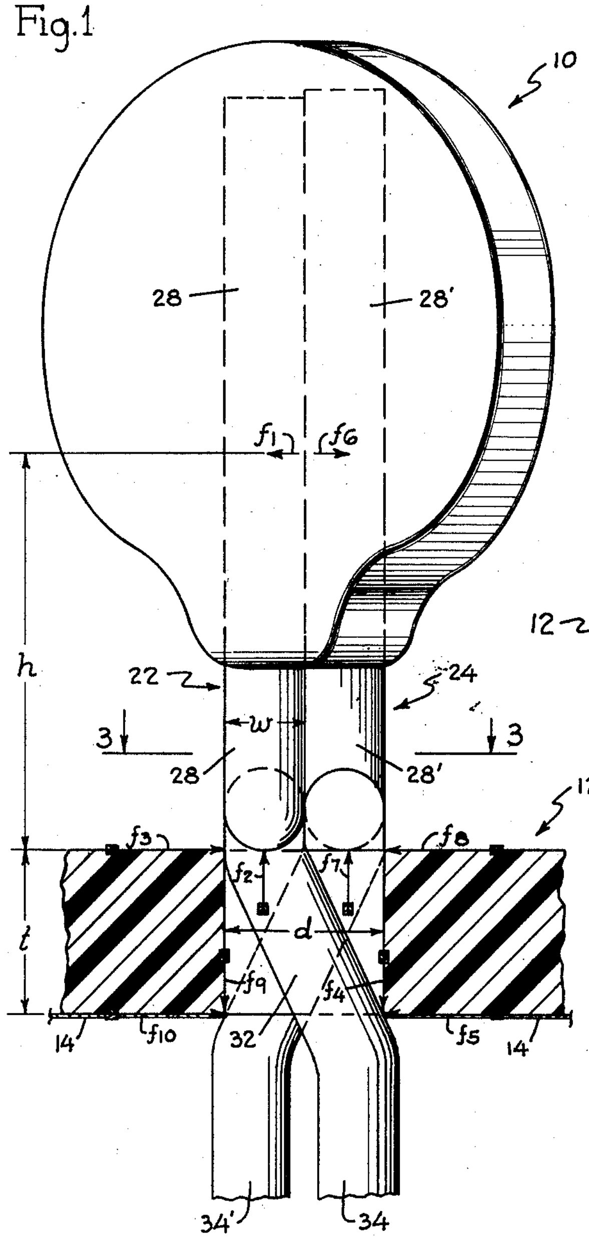
FIG. 1 is an enlarged end elevational view, partially in section, of a preferred embodiment of lead-locking arrangement for an electrical component.

Returning now to FIG. 2 of the drawings, an electrical component, here shown in the form of a rolled capacitor 10, is mounted on an electrical circuit panel board 12 having metalized electrical circuit portions 14 deposited on one side thereof in the conventional manner, said circuit board being made of insulating material. A pair of spaced holes 16–18 are conventionally formed in the panel 12, said holes having a predetermined diameter and a common center line 20. For purposes of a force diagram explanation, the holes have a diameter of *"d,"* the panel 12 has a thickness *"t,"* the terminal leads (to be later discussed) have an effective height *"h"* and a diameter *"w."*

The capacitors, which are shown for puposes of illustrating the invention, may be of any known design. Conventionally they are formed of alternate layers of foil and insulation, the depending leads 22–24 being attached to opposite sides thereof for connection with the metal foil (or similar conductive material) on opposite ends of the capacitor, the entire capacitor then being encapsulated by a suitable epoxy-wax covering 26 to hermetically seal same.

Figure 3:
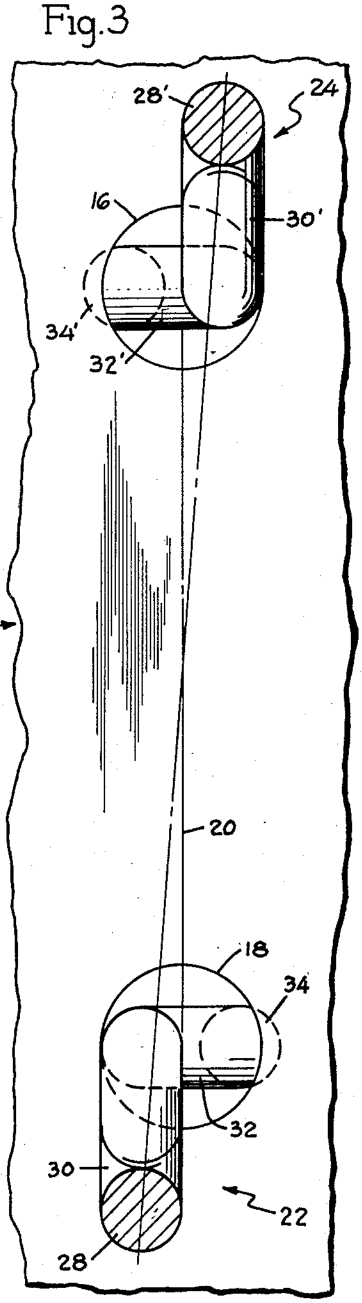
FIG. 3 is a sectional view along lines 3—3 of FIG. 1.
Figure 2:
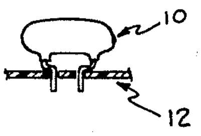
FIG. 2 is a front elevational view, more nearly akin to the actual over-all size of the component, of the assembly shown in FIG. 1.
Figure 8:
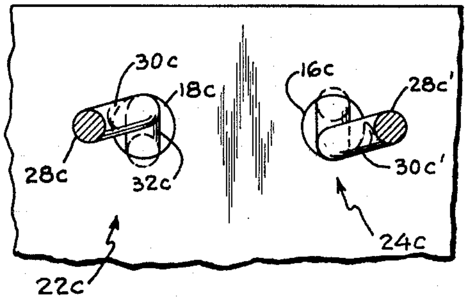
FIG. 8 is a sectional view similar to those in FIGS. 3, 5 and 7 showing an alternate arrangement of lead locking to that shown in FIGS. 1 through 3, the other parts of the assembly being the same.

The leads 22–24 are substantially identically formed, although one is the mirror image of the other. I will describe lead 22 and I have applied identical reference numerals to lead 24 in primed form. Each lead is formed with a substantially straight first portion 28 which is physically attached to the interior ends of the capacitor in electrical conducting relation and extends therebelow as shown in FIGS. 1 and 2. The lead wire is then formed with a substantially horizontal portion 30 to provide a panel-engaging surface for engaging the top surface of the board 12. These panel-engaging surfaces may extend either toward each other, or away from each other as desired. The portion 30–30' of the two leads extend toward each other generally parallel to the center line 20 connecting the centers of the two holes 16 and 18. It should be noted that portion 30 need not always be exactly parallel with the center line and in the embodiment as shown in FIG. 8, it is offset from the center lines as shown at 30C and 30C'. Further, the portion 30 need not be in engagement with the top surface of the panel along its entire length, it being preferred, however, that it engage the top surface somewhere along its extent. An intermediate portion 32 of the lead extends transversely across the center line 20 of the two apertures 16 and 18 so as to contact the margins of the apertures 16 and 18 adjacent the top and bottom surfaces of the panel board 12. The entering end portion 34 extends below portion 32 and in the final assembled relation is offset slightly from the confines of the apertures 16 and 18, as best shown in FIG. 3. It will be noted that upon assembly of the electrical component 10 to the panel board, the axis of the component is slightly offset from the center line 20 connecting the apertures. Further, the lead portions 28–30 of lead 22 and the lead portions 28′–30′ of lead 24 are disposed on opposite sides of the center line, portion 32 and 32′ extending directly across the center 20 along the axis of the individual apertures or bores 16 and 18 from opposite sides thereof. Thus, the entering end portions 34–34′ are on opposite sides of the center line 20 from their respective lead portions 28–30 and 28′–30′.

The translational equilibrium of the component (the near lead 22 only being considered) will show that $f_2=f_4$ and $f_3=f_1+f_5$. The rotational equilibrium is shown by the equation $$f_1h+\frac{f_2w}{2}=f_4d+f_5t$$

Thus, in FIG. 1 when the capacitor body is forced to the left, $f_3$ and $f_5$ increase; when the capacitor body is forced to the right $f_8$ and $f_{10}$ increase; when the capacitor body is forced upward $f_4$ and $f_9$ increase; when the capacitor body is forced downward $f_2$ and $f_7$ increase; when the capacitor body is forced along its own axis, both legs or leads 22–24 oppositely react and therefore the capacitor body or other electrical components so mounted is stable.

It is, thus, apparent that with the configuration shown, the mounting of the electrical component on the panel board prior to soldering thereof provides a repeatable, constant dimension height of the component above the panel board; prevents retrogressive unauthorized retraction of the component during assembly of other components; provides a positive controlled retention during the soldering operation and immediately subsequent thereto while the solder is cooling.

Figure 4:
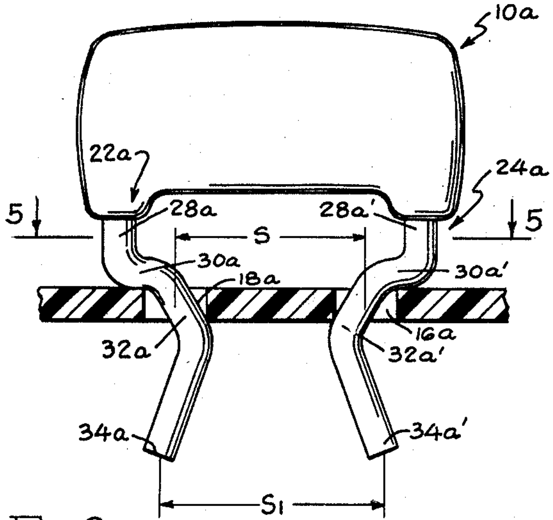
FIG. 4 is a front elevational view of an alternate embodiment of lead-locking arrangement.
Figure 5:
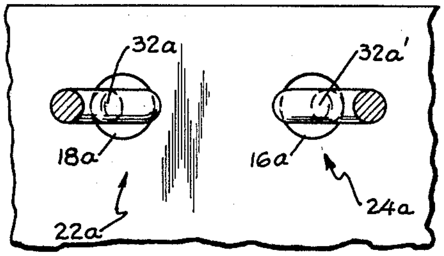
FIG. 5 is a sectional view taken along lines 5—5 of FIG. 4.

Another embodiment of the invention is shown in FIGS. 4 and 5 and similar parts will be shown with similar reference numerals with the addition of the suffix "a." The locking attachment leads *22a–24a* in this embodiment are located on the center line of the two apertures *16a–18a* and extend across the diameter of the respective apertures as best shown in FIG. 5. The entering ends *34a–34a′* have an initial dimension "S" prior to insertion in the holes in the panel and due to the forces imposed thereon after insertion are spread apart of further dimension represented by $S_1$. Thus each lead terminal *22a–24a* is held under compression by the impingement of portions *32a–32a′* against the lower edges of the apertures *16a* and *18a*. While this embodiment maintains a constant repeatable height dimension for the electrical component as well as firmly locking the device in position, it is subject to some wobble if severe forces are applied to the component *10a*.

Figure 6:
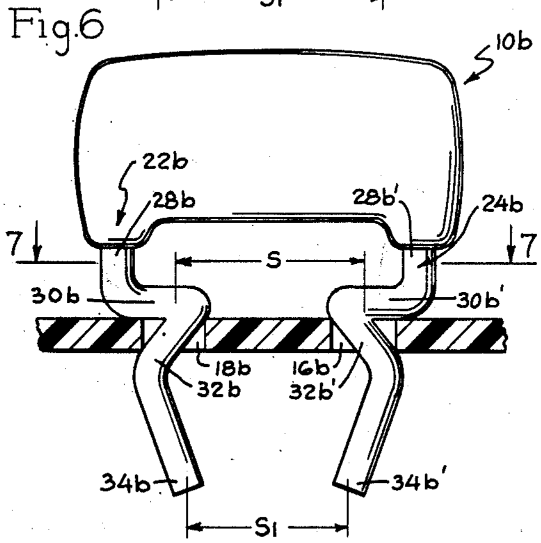
FIG. 6 is a front elevational view, similar to FIG. 4 of still another embodiment of lead-locking arrangement.
Figure 7:
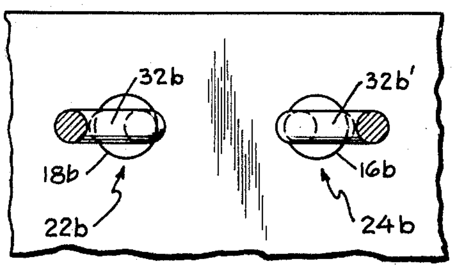
FIG. 7 is a sectional view along lines 7—7 of FIG. 6.

The embodiment shown in FIGS. 6 and 7 has many similar configurations and similar parts shall be identified with similar reference numerals with the addition of the suffix "*b*." The component *10b* has an elongated portion *30b–30b′* which extends completely across the aperture *16b–18b* so that the offset portion *32b–32b′* extends generally away from each other and impinge upon the margins of the aperture *16b–18b* from an inside to outside manner as viewed in FIG. 6. The entering ends have an initial dimension "S" which is reduced to the dimension $S_1$ after insertion indicating the compression forces on the respective terminals which provides the desired retention. This embodiment is also subject to wobble, but does maintain the accurate dimensioned height of the component above the panel board, as well as good solid retention upon the panel.

The embodiment illustrated in FIG. 8 is substantially identical to that shown in FIGS. 1 to 3 and similar parts shall be shown with similar reference numerals with the addition of the suffix "*c*." In this embodiment the capacitor body or other electrical component body *10c* may be aligned with the center line of the apertures in which the terminals are to be inserted. Thus portions *30c′* and *30c* are offset from the center line connecting the two apertures and common thereto so as to position offset portions *32c–32c′* on opposite sides of the common line.

Having thus described several embodiments of terminal lead-locking arrangements, it is to be understood that the illustrated forms were selected to facilitate the disclosure of the invention rather than to limit the number of forms which the invention may assume. Various modifications, adaptations and alterations may be applied to the specific forms shown to meet the requirements of practice, without in any manner departing from the spirit or scope of the present invention, and all such modifications, adaptations, and alterations are contemplated which may come within the scope of the appended claims.

What is claimed as the invention is:

1. The combination of a printed circuit board panel, said panel having a top and bottom surface one of which has an electric circuit printed thereon and a pair of spaced bores formed therethrough of substantially the same predetermined diameter, said spaced bores being arranged to be adjacent to different portions of said electric circuit, and a component having a pair of terminal substantially constant diameter wires electrically and physically attached thereto in generally depending relation, said terminal wires each having a first portion adjacent said component which are spaced apart a greater dimension than the dimension between the centers of said bores, each of said terminal wires having a second portion connected to said first portion and extending generally toward each other, an entering end portion spaced from said second portion, and an offset intermediate portion connecting said entering end and second portions, said intermediate portion having a cross-sectional dimension less than said predetermined diameter and being configured to engage the margins of said aperture at spaced points adjacent the top and bottom surfaces of said panel to impart stability in mounting said component prior to soldering thereof.

2. A device for mounting an object to a panel comprising (*a*) an object having a pair of constant cross-sectional size depending attachment member means for mounting said object to a panel having a surface with a pair of spaced apertures formed therein of substantially the same predetermined size, (*b*) each attachment member means having a first portion parallel to the other, located immediately adjacent said object and spaced a greater dimension than the dimension between the centers of said apertures, (*c*) each of said attachment member means being configured to provide a panel surface engaging portion means each located in an area bounded by said parallel spaced first portions, (*d*) said attachment member means having an entering end portion, (*e*) and said attachment member means having an offset intermediate portion between said entering end and said first portion, said intermediate portion having a cross-sectional dimension less than the predetermined size of the complementary panel apertures and being individually configured to engage the margins of individual apertures at spaced points as measured along the axis of said apertures to impart stability in mounting said object to said panel.

3. An article of manufacture, comprising a component (*a*) having a pair of substantially constant diameter terminal wire means electrically and physically attached thereto in generally depending relation, for attaching said component to a printed circuit board panel prior to soldering thereof, said panel haivng a top and bottom surface one of which has an electric circuit printed thereon and a pair of spaced bores formed therethrough of substantially the same predetermined diameter, said spaced bores being arranged to be adjacent to different portions of said electric circuit, (*b*) said terminal wire means each having a first portion adjacent said component which are spaced apart a greater dimension than the dimension between the centers of said apertures, (*c*) each of said terminal wire means having a second portion connected to said first portion and extending generally toward each other, (*d*) each of said terminal wire means having an entering end portion spaced from said second portion, (*e*) and each of said terminal wire means having an offset intermediate portion means connecting said entering end and second portions, said offset intermediate portion means having a cross-sectional dimension less than said predetermined diameter and each respectively being configured to engage the margins of one of said pair of apertures at spaced points adjacent the top and bottom surfaces of a panel to impart stability in mounting said component prior to soldering thereof.

4. The device set forth in claim 2 wherein said first portion of said attachment member means are disposed on opposite sides of the common center line of said apertures upon assembly of said object to said panel.

5. The device set forth in claim 4 wherein said intermediate portions extend generally transverse to and across the common center line of said apertures from opposite sides thereof.

6. The article set forth in claim 3 wherein said second portions each have parts which are spaced from each other by a dimension greater than the greatest dimension between any points on the respective margins of said bores adjacent one surface of said panel.

7. The article set forth in claim 3 wherein said second portions each extend toward each other to a point beyond the closest adjacent marginal edges of said bores in said panel.

8. The article set forth in claim 3 wherein said second portions each extend toward each other to a point substantially adjacent to the centers of said respective bores to which said terminal wire means are to be assembled.

9. The article set forth in claim 8 wherein said offset intermediate portion means of said terminal wire means extend through the axis of the respective bores and across a plane common to the axis of both bores from opposite sides thereof to engage the margins of said respective bores at points thereon representing substantially mirror images of each other.

References Cited by the Examiner

UNITED STATES PATENTS

| | | | |
|---|---|---|---|
| 2,587,568 | 2/52 | Eisler | 339—17 |
| 2,754,486 | 7/56 | Hathorne | 317—101 |
| 2,777,193 | 1/57 | Albright | 317—101 |
| 2,898,518 | 8/59 | Lynn | 317—101 |
| 2,902,629 | 9/59 | Little | 317—101 |
| 3,056,939 | 10/62 | Rayburn | 317—17 |

JOHN F. BURNS, *Primary Examiner.*

SAMUEL BURNSTEIN, *Examiner.*